United States Patent [19]

Tsuchiya et al.

[11] 4,175,241
[45] Nov. 20, 1979

[54] MASTER-SLAVE FLIP-FLOP CIRCUIT

[75] Inventors: Takao Tsuchiya, Fujisawa; Susumu Akazawa, Tokyo; Kyoichi Murakami, Chigasaki, all of Japan

[73] Assignee: Sony Corporation, Tokyo, Japan

[21] Appl. No.: 909,111

[22] Filed: May 24, 1978

Related U.S. Application Data

[63] Continuation of Ser. No. 764,045, Jan. 31, 1977, abandoned.

[51] Int. Cl.² ............................................. H03K 1/12
[52] U.S. Cl. .................................. 307/262; 307/291; 328/155
[58] Field of Search ................ 307/262, 291; 328/155; 358/14, 18, 24

[56] References Cited

U.S. PATENT DOCUMENTS 3,622,803  11/1971  Cooper et al. .................... 307/289 X

FOREIGN PATENT DOCUMENTS 1262128  2/1972  United Kingdom.

Primary Examiner—John Zazworsky
Attorney, Agent, or Firm—Lewis H. Eslinger; Alvin Sinderbrand

[57] ABSTRACT

This invention is a phase inversion circuit of improved stability of operation for a master-slave flip-flop circuit. An additional gating circuit is controlled by two signals, one from an output of the slave flip-flop circuit and the other from an externally applied phase inversion signal. The output of the additional gating circuit is connected to the master flip-flop circuit through a circuit means that also receives a signal from the slave flip-flop output circuit. In the absence of inversion signals the circuit means controls the master flip-flop circuit from the slave flip-flop circuit and the master flip-flop circuit controls the slave flip-flop circuit with the assistance of the timing pulses in the usual manner. The phase inversion signal can be applied over a wide range of timing intervals of the timing circuit provided the inversion signal overlaps at least partly one of the timing pulses of the regular timing signal when the normal output signal of the slave flip-flop is a "0" and the normal output signal of the master flip-flop circuit is also a "0".

9 Claims, 7 Drawing Figures

MASTER-SLAVE FLIP-FLOP CIRCUIT

This is a continuation, of application Ser. No. 764,045, filed Jan. 31, 1977, now abandoned.

BACKGROUND OF THE INVENTION

1. Field of the Invention

This invention relates generally to master-slave flip-flop circuits and more particularly is directed to a phase inverter for a master-slave flip-flop circuit to invert the phase of the output signals of the master and slave flip-flop circuits at any desired time by means of a phase inverting signal wherein the tolerance for selecting the pulse width and phase of the phase inverting signal is relatively large.

2. The Prior Art

In PAL color television receivers master-slave flip-flop circuits are frequently used as a circuit to generate switching signals. At certain times the phase of the output signal of the flip-flop circuit must be inverted. A typical master-slave flip-flop circuit includes an input terminal to which an input timing signal is applied. One of the two output terminals of the master flip-flop is connected to one of two input terminals of an AND gate and the other output terminal of the master flip-flop is connected to one of two input terminals of another AND gate. The two output terminals of the AND gates are connected to the SET and RESET terminals of the slave flip-flop. The output terminals of the slave flip-flop are the output terminals of the master-slave flip-flop circuit, and each of these output terminals is connected to one input terminal of each of a second pair of AND gates. The master-slave flip-flop circuit has a signal receiving input terminal connected to the other input terminal of each of the first pair of AND gates, and the same input terminal is connected through an inverter to the other input terminal of each AND gate of the second pair. The output terminals of the second pair of AND gates are connected to the RESET and SET terminals, respectively, of the master flip-flop.

Normally the input signal to control the operation of the master-slave flip-flop circuit is a square wave having a desired repetition rate. The output signal of the master flip-flop is also a square wave having one-half the repetition rate of the input signal, and the output signal of the slave flip-flop has the same repetition rate as the master flip-flop but is timed to be offset by one-fourth of a complete cycle relative to the master flip-flop output signal.

When it is desired to invert the phase of the master and slave flip-flop circuits one of the input pulses may be eliminated or an additional input pulse may be inserted. However, the duration and the timing of the phase inverting signal must be such that its leading edge occurs when the regular input signal has a "0" value and the inverting signal must terminate after one pulse of the regular input signal has been eliminated and the signal level of the normal timing signal is again at its "0" value. Alternatively, to add an extra control pulse, the additional inverting signal must be quite narrow so that it can start and finish in the same half cycle of the regular timing signal when the regular timing signal has a "0" value. These timing limitations make it difficult to provide a satisfactory inverting operation. The circuit for forming the phase inverting signal must be very complicated, and it is susceptible to noise superimposed on the phase inverting signal.

OBJECTS AND SUMMARY OF THE INVENTION

One of the principal objects of this invention is to provide an improved phase inverting circuit for a master-slave flip-flop circuit to generate a phase inverting signal that has a relatively wide leeway as to timing and duration.

A circuit to obtain improved operation of phase inversion in a master-slave flip-flop circuit includes a second input signal terminal connected to one input terminal of an additional AND gate. The circuit also includes an OR gate that has its output terminal connected to the SET input terminal of the master flip-flop and one of its input terminals connected to the output terminal of the AND gate that has one of its input terminals connected to the complementary output terminal of the slave flip-flop. This complementary slave flip-flop output terminal is also connected to one of the input terminals of the AND gate in the inverting circuit and the output terminal of this latter AND gate is connected to another input terminal of the OR gate. The base input terminal of a transistor is also connected to the output of the additional AND gate, and the emitter-collector circuit of the transistor is connected between the phase inversion signal input terminal of that AND gate and ground so that a "1" signal generated at the output of the additional AND gate creates a short circuiting condition at the phase inversion input terminals of that AND gate and thus creates a "0" which turns the AND gate off to prevent the AND gate from remaining conductive for a long period.

BRIEF DESCRIPTION OF THE DRAWINGS

The main and other objects of this invention which will become apparent hereinafter to those skilled in the art will be described in the following specification with reference to the drawings in which.

DETAILED DESCRIPTION OF THE PREFERRED EMBODIMENTS

Figure 1:
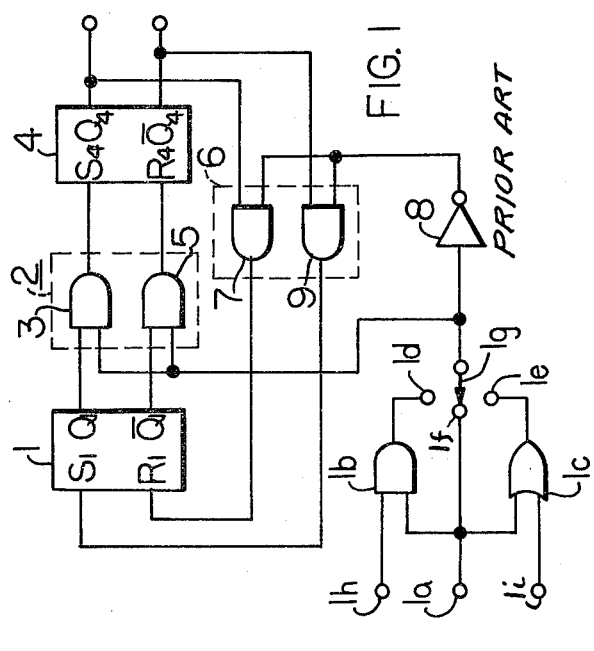
FIG. 1 is a block circuit diagram of a typical existing master-slave flip-flop that has provisions for dropping out or adding a timing pulse to achieve phase inversion.

The circuit in FIG. 1 has an input terminal 1a to which the normal timing signal is applied. The circuit as shown includes an AND gate 1b and an OR gate 1c, each of which has an input terminal connected to the terminal 1a. The output terminals of the OR gate and the AND gate are connected to two terminals 1a and 1d, respectively, of a three-position switch 1g that has a third terminal 1f connected directly to the input terminal 1a. This input circuit is not normally used in a master-slave flip-flop circuit but is shown here only as a convenient way of providing means to apply an inversion signal in accordance with existing practice.

The master flip-flop is identified by reference numeral 1 and its normal output terminal $Q_1$ is connected to a first gating circuit 2. More specifically the $Q_1$ output terminal of the master flip-flop 1 is connected to one of two input terminals of an AND gate 3 that is one of the components of the gating circuit 2. The output of the AND gate 3 is connected to the SET input terminal $S_4$ of the slave flip-flop 4. The complementary output terminal $\overline{Q_1}$ of the master flip-flop 1 is connected to one of the input terminals of an AND gate 5 that is the other component of the gating circuit 2. The output of the AND gate 5 is connected to the RESET terminal $R_4$ of the slave flip-flop circuit 4.

The normal output terminal $Q_4$ of the slave flip-flop 4 is connected to one of the input terminals of a second gating circuit 6, specifically, the terminal $Q_4$ is connected to one of two input terminals of an AND gate 7 that forms one of the components of the gating circuit 6. With the arm 1g connecting the input terminal 1a directly to the master-slave flip-flop circuit, a normal timing signal is applied to the second input terminal of each of the AND gates 3 and 5 and to the input of an inverter 8 that inverts the signal and connects it to the second input terminal of the AND gate 7. The complementary output terminal $\overline{Q_4}$ of the slave flip-flop 4 is connected to one of the terminals of an AND gate 9 that forms the second component of the gating circuit 6, and the output terminal of the inverter 8 is also connected to the second input terminal of the AND gate 9. The output terminal of the AND gate 9 is connected to the SET input terminal $S_1$ of the master flip-flop 1 and the output terminal of the AND gate 7 is connected to the RESET input terminal $R_1$ of the master flip-flop circuit.

Figure 2:
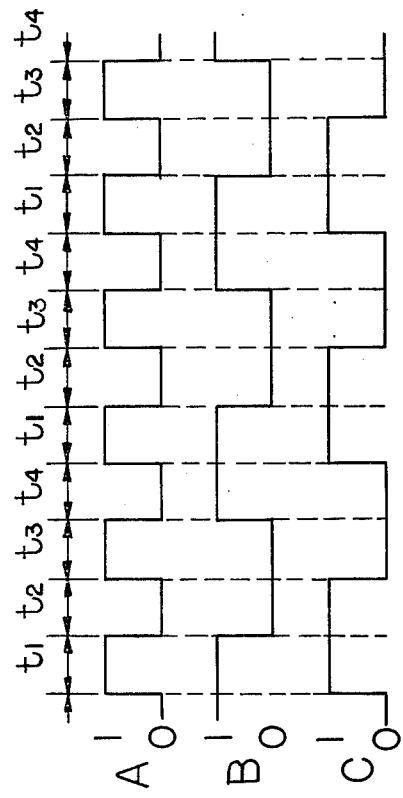
FIG. 2 shows the operating signals achieved in the circuit in FIG. 1 in the absence of phase inversion.

The normal operation of the master-slave flip-flop circuit in FIG. 1 will first be described without any phase inversion but with reference to the waveforms in FIG. 2. The normal timing signal in FIG. 2A has a value of "1" for one unit of time $t_1$ followed by a value of "0" for an equal interval of time $t_2$. This cycle is repeated for the intervals $t_3$ and $t_4$ and then starts over again at $t_1$. Assuming that the period $t_1$ in FIG. 2 begins when the input signal in FIG. 2A goes from "0" to "1" and the normal output signal from the $Q_1$ terminal of the master flip-flop 1 is already at the value "1," and the normal output signal at the terminal $Q_4$ of the slave flip-flop has been at "0," the effect of applying a "1" signal to both input terminals of the AND gate 3 causes that AND gate to apply a "1" signal to the SET input terminal $S_4$ of the slave flip-flop and raise the normal value of the output signal at the terminal $Q_4$ from "0" to "1." At the same time the complementary output signal at the terminal $\overline{Q_1}$ of the master flip-flop is "0" so that the output of the AND gate 5 is also "0" resetting signal is applied to the RESET input terminal $R_4$ of the slave flip-flop.

At the end of the period $t_1$, the input signal applied to the terminal 1a reverses to "0," which is inverted by the inverter 8 to a value "1" and applied to the AND gate 7. Since the normal output signal at the terminal $Q_4$ of the slave flip-flop is already "1," as shown in FIG. 2C, a "1" signal is applied from the AND gate 7 to the RESET terminal $R_1$ of the master flip-flop 1, thereby resetting the master flip-flop circuit and making its normal output signal at the terminal $Q_1$ "0" and its complementary output signal at the terminal $\overline{Q_1}$ "1." At the end of the interval $t_2$, the timing signal applied to the terminal 1a goes to its "1" value and thereby makes the output of the AND gate 5 "1" since both of its input terminals have a "1" signal applied to them. The "1" output signal of the AND gate 5 is applied to the RESET terminal $R_4$ to reset the slave flip-flop 4 and cause its normal output voltage at the terminal $Q_4$ to drop to "0" as shown in FIG. 2C while its complementary output terminal $\overline{Q_4}$ returns to a "1". These output signals disable the AND gate 7 and enable the AND gate 9. As a result, when the input signal applied to the input terminal 1a drops to "0" at the end of the interval $t_3$, the inverter 8 reverses this value from "0" to "1" and allows a "1" signal to be applied to the SET input terminal $S_1$ of the master flip-flop 1. This brings the condition of the circuit during the interval $t_4$ back to the same condition that it had prior to the initial interval $t_1$ and thus completes a cycle of operation. A new cycle begins with a second interval $t_1$ and the beginning of each successive interval $t_1$.

When the input signal is "1" only the first gating circuit 2 is operative, or enabled, and when the input signal at the terminal 1a is "0" only the second gating circuit 6 is operative. Therefore, when the input signal is "1," the state of the slave flip-flop 4 changes, and when the input signal is "0," the state of the master flip-flop circuit 1 changes. This produces stable operation of the master-slave flip-flop in response to the signal in FIG. 2A being applied to the input terminal 1a and the switch arm 1g connected to the terminal 1f.

Figure 3:
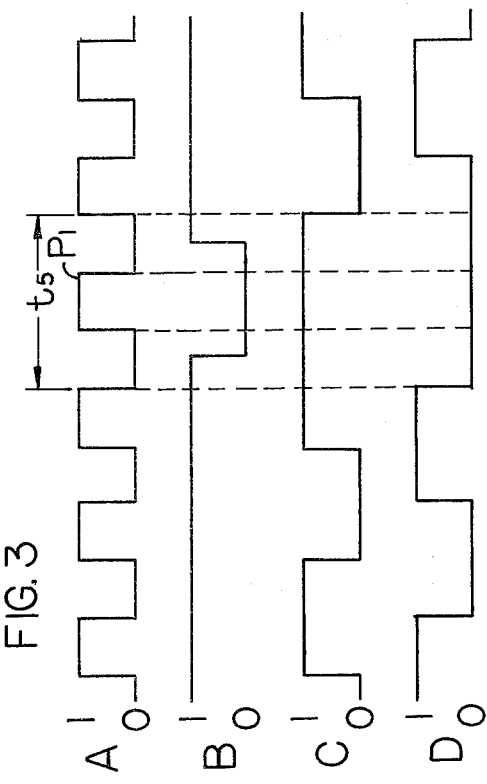
FIG. 3 shows signals in the circuit of FIG. 1 when the circuit is operating to invert the phase of the output signals by deleting one of the regular timing pulses.

Sometimes the phase of the output signal of the master-slave flip-flop circuit must be inverted at a certain time. For example, such operation is required in PAL color television receivers for certain circuits that require such phase inversion at the end of each vertical scanning interval. FIG. 1 shows two means of providing inversion. The first uses the AND gate 1b and requires that the switch arm 1g be shifted to engage the terminal 1a at the output of the AND gate 1b. The timing circuit applied to the input terminal 1a is shown in FIG. 3 and is the same as the timing signal shown in FIG. 2A. An inverting signal shown in FIG. 3B is applied to the second input terminal 1h of the AND gate 1b. This inverting signal in FIG. 3B has a value "1" except during a certain part of the interval $t_5$, which extends from the beginning of the "0" value of one of the timing intervals in the signal shown in FIG. 3A immediately preceding a timing signal pulse $P_1$ that occupies the next timing interval and has the value "1." The interval $t_5$ continues to some part of the timing interval immediately following the pulse $P_1$ when the signal in FIG. 3A is again at its "0" value. The effect of applying the phase inverting signal in FIG. 3B to the input terminal 1h is to allow all of the regular timing pulses of the signal in FIG. 3A to pass through the AND gate 1b except the pulse $P_1$ that occurs when the signal in FIG. 3B has a "0" value. The pulse thus eliminated is the pulse $P_1$ in FIG. 3A. Except for the elimination of this pulse from the normal timing signal, the operation of the master-slave flip-flop remains the same as described in connection with the non-inverting operation. The effect of eliminating pulse $P_1$ entirely is to cause the circuit in FIG. 1 to maintain the status it achieved when the timing signal shown in FIG. 3A dropped to its "0" value preceding the time of occurrence of the pulse $P_1$. Since there is no pulse $P_1$ to affect the status of the master flip-flop 1 or the slave flip-flop 4 in FIG. 1, they maintain the voltage conditions in which the normal output signal at the terminal $Q_4$ of the slave flip-flop 4 is at its "1" value and the normal output value at the terminal $Q_1$ of the master flip-flop 1 remains at its "0" value. At the end of the phase inversion pulse shown in FIG. 3B, which must occur prior to the next positive pulse following the pulse $P_1$ in the timing signal in FIG. 3A, the circuit is free to make the changes that it would normally make insofar as the states of conductivity of the master flip-flop 1 and the slave flip-flop 4 are concerned. That is, when the value of the timing signal in FIG. 3A goes positive from the "0" value to the "1" value following the missing pulse $P_1$, the voltage value at the terminal $Q_4$ drops to "0." Later after the passage of another unit of time equal to the width of the positive pulse following next after the pulse $P_1$, the master flip-flop would change its state of conductivity from "0" to "1." In effect what has happened is that the output voltage conditions of both the master and slave flip-flops remain unchanged for an additional two intervals of time of the timing signal in FIG. 3A. As measured in the chart in FIG. 2A, these two intervals could be $t_1$ and $t_2$ or $t_3$ and $t_4$ or any repetition of those pairs. This changes the condition of conductivity of the master and slave flip-flops to the reverse of what they would have been if the pulse $P_1$ had been allowed to pass through to the gating circuits 2 and 6 in the normal manner.

Figure 4:
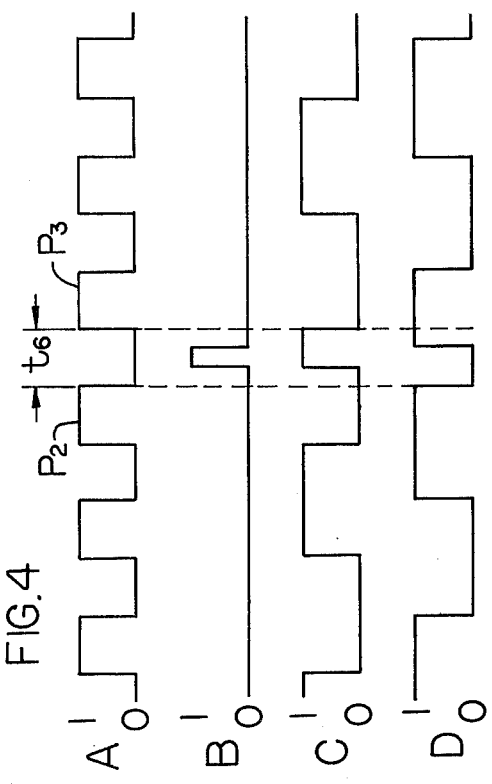
FIG. 4 shows operating signals in the circuit in FIG. 1 when the circuit is arranged to invert the phase of the output signals by adding a short duration phase inversion pulse.

The other form of phase inversion is accomplished by connecting the switch arm 1g to the contact 1e at the output of the OR gate 1c. The waveforms in FIG. 4 show the operation. In this configuration of the circuit the phase inverting pulse is shown in FIG. 4B and must be less than one unit of time indicated by the time interval $t_6$ in FIG. 4A, the timing waveform. This phase inversion signal is applied to an input terminal 1i of the OR gate 1c.

In accordance with the usual operation of an OR gate, the timing signal in FIG. 4A, which is actually identical with the timing signal in FIG. 2A, passes through to the switch arm 1g without change, provided the inversion pulse in FIG. 4B does not partially overlap with the pulses $P_2$ and $P_3$ on either side of the time interval $t_6$ in FIG. 4A. FIG. 4C shows the signal at the complementary output terminal $\overline{Q_4}$ of the slave flip-flop 4 in FIG. 1, and FIG. 4D shows the regular output signal at the terminal $Q_1$ of the master flip-flop 1 in FIG. 1. The leading edge of the phase inversion pulse in FIG. 4B causes the AND gates 3 and 5 to be enabled. At this time the complementary output at the terminal $\overline{Q_1}$ has the value "1" and can therefore pass through to the RESET terminal $R_4$ of the slave flip-flop 4. The output of the AND gate 3 is kept at a "0" value and it is this value that is applied to the SET terminal $S_4$ of the slave flip-flop 4. These conditions cause the slave flip-flop to be reset so that the output at the $Q_4$ terminal drops to its "0" value and the output at the complementary terminal $\overline{Q_4}$ therefore rises to its "1" value. The master flip-flop 1 does not change its condition of conductivity until the phase inversion signal in FIG. 4B is terminated and drops to its "0" value during the interval $t_6$. This enables the AND gates 7 and 9. Since the complementary output terminal $\overline{Q_4}$ is at its "1" value, a "1" signal is available at the output terminal of the AND gate 9 but only a "0" value is available at the output terminal of the AND gate 7. The "1" value output signal from the AND gate 9 is applied to the SET terminal $S_1$ of the master flip-flop 1 and switches the state of conductivity of that flip-flop so that the normal terminal $Q_1$ rises to a "1" value and, correspondingly, the complementary terminal $\overline{Q_1}$ drops to "0.". These conditions are shown in FIGS. 4C and 4D. Thereafter, it will be observed that the operation of the master-slave flip-flop continues but with its phase inverted from what it was prior to the phase inversion pulse.

Both of these arrangements for applying phase inversion signals to a master-slave flip-flop circuit require very accurate generation of the phase inversion pulses both in terms of beginning and ending and in terms of duration of these pulses. In terms of the switching signal generating circuit in PAL color television receivers, the phase inversion pulse must be accurately timed with respect to the pulse width of a single horizontal time interval, which means that the pulses must be very accurately timed. This is difficult to obtain and therefore it has been required in the past that the circuit for forming the phase inversion signal must be very complicated to operate with sufficient accuracy. Furthermore, if electrical noise is superimposed on the phase inversion signal the noisy operation will be usable, and misoperation will easily occur.

Figure 5:
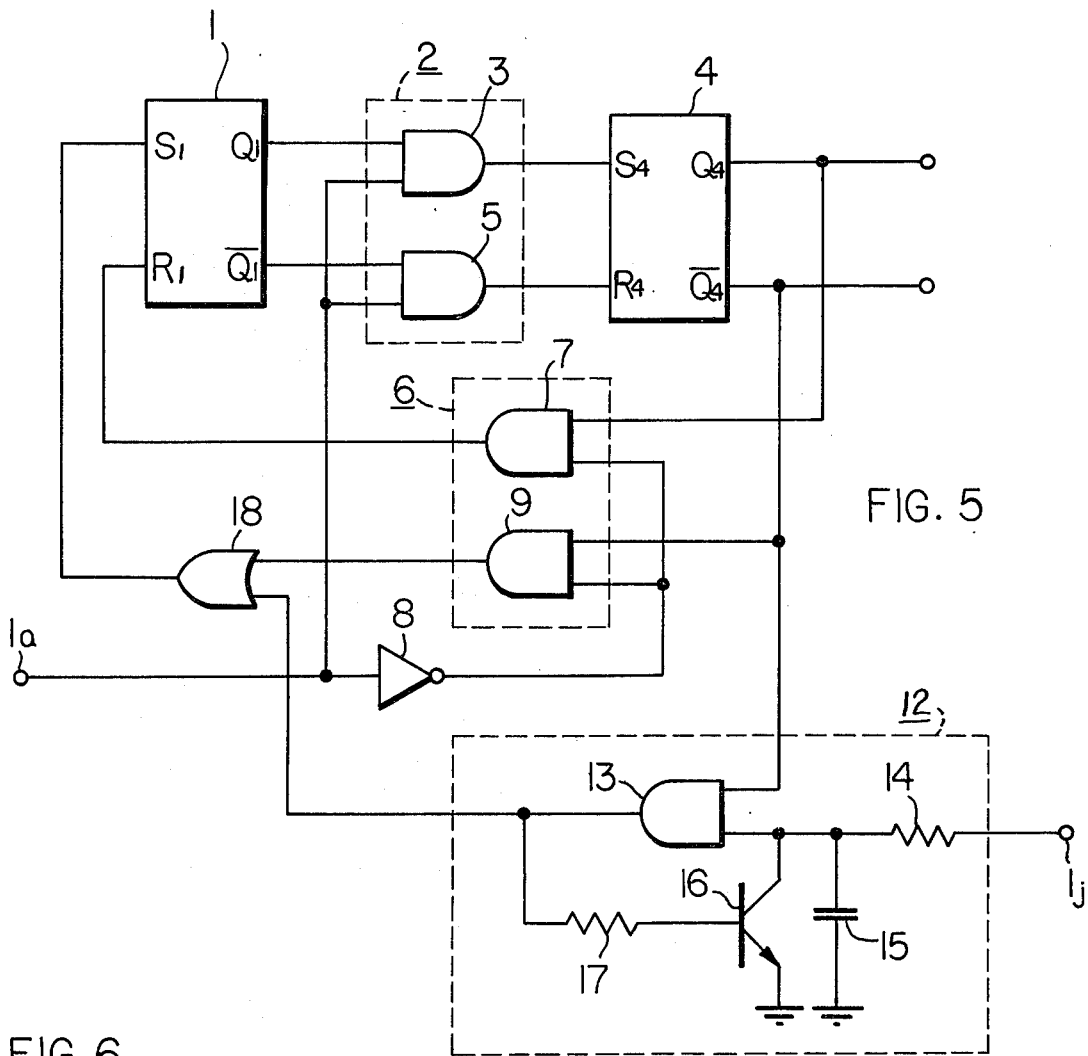
FIG. 5 shows a block circuit diagram for obtaining improved phase inversion of the master-slave flip-flop output signals in accordance with the present invention.

FIG. 5 shows one embodiment of the present invention. The master-slave flip-flop section of FIG. 5 is identical with that of FIG. 1 except that FIG. 5 has a third gating circuit 12 and an additional OR gate 18. The gating circuit includes an input terminal 1j to which a phase inversion signal is applied. This terminal is connected to one of two input terminals of an AND gate 13 by way of an RC circuit comprising a resistor 14 and a capacitor 15 that slightly delay or integrate pulses applied to the internal 1j. The circuit 12 also includes a transistor 16 that has its emitter-collector circuit connected directly in parallel with the capacitor 15. The output of the AND gate 13 is connected by means of a series resistor 17 to the base of the transistor 16 and is also connected to one of the input terminals of the OR gate 18. The other input terminal of the OR gate 18 is connected to the output terminal of the AND gate 9, and the output of the OR gate 18 is connected to the SET input terminal $S_1$ of the master flip-flop 1. The complementary output terminal $\overline{Q_4}$ of the slave flip-flop 4 is connected to one of the input terminals of the AND gate as shown in the circuit in FIG. 1 and is also connected to the second input terminal of the AND gate 13.

The operation of the circuit in FIG. 5 will be described in relation to waveforms in FIG. 6. The waveform in FIG. 6A is the timing pulse signal similar to the timing pulse signals previously considered in FIGS. 2-4. FIG. 6B shows the signal at the regular output terminal $Q_4$ of the slave flip-flop 4, and FIG. 6C shows the signal at the complementary output terminal $\overline{Q_4}$ of the slave flip-flop 4. FIG. 6D shows a phase inversion signal that happens to begin during the time interval $t_7$ and FIG. 6E shows the normal output signal at the terminal $Q_1$ of the master flip-flop 1.

The operation of the circuit in FIG. 5 is identical with that of the circuit in FIG. 1 for the first five timing intervals $t_2$, $t_3$, $t_4$, $t_1$ and $t_2$. Therefore it is unnecessary to describe again the way in which the signals in FIGS. 6B, 6C and 6E are generated prior to the interval $t_7$. The interval $t_7$ is so identified simply to set it apart from the regular intervals in which the phase inversion signal does not fall; actually it is an interval that includes a positive pulse $P_4$ of the timing signal in FIG. 6A. Also at the beginning of the interval $t_7$ the normal output at the terminal $Q_4$ of the slave flip-flop drops to its "0"

value as shown in FIG. 6B, and the complementary output terminal $\overline{Q_4}$ rises to its "1" value to enable the AND gate 13. The phase inversion signal shown in FIG. 6D occurs shortly after the beginning of the time interval $t_7$ and produces a "1" signal at the output of the AND gate 13. This signal passes through the OR gate 18 to the SET input terminal $S_1$ of the master flip-flop 1 and thereby changes the conditions of the conductivity at the normal and complementary output terminals $Q_1$ and $\overline{Q_1}$. As a result, the voltage value at the output terminal $Q_1$ rises to "1." The signal at the normal output terminal $Q_1$ and the complementary signal at the output $\overline{Q_1}$ of the master flip-flop are applied to the SET input terminal $S_4$ and the RESET terminal $R_4$, respectively, through the AND gate circuits 3 and 5. The "1" value signal at the normal output terminal $Q_1$ thus sets the slave flip-flop 4 so that its signal value at the normal output terminal $Q_4$ becomes "1." As a result, the phase of the regular output terminals of the master and slave flip-flop circuits are inverted from that point on as shown in the right hand portion of the signals of FIGS. 6B, 6C and 6E.

The pulse width of the phase inverting signal shown in FIG. 6D can be selected to have any value within the time region indicated by the broken line in FIG. 6D, provided at least part of the phase inversion signal overlaps with at least part of the time interval $t_7$. Even if impulse noise is superimposed on the phase inversion signal, such noise can be eliminated by the integrating circuit formed by the resistor 14 and the capacitor 15.

When the output of the AND gate 13 is raised to "1" by having a "1" signal applied to both of its input terminals, this "1" output signal fed to the base of the transistor 16 through the resistor 17 causes the transistor 16 to become conductive and thereby to drop the level of the lower input terminal of the AND gate 13 to "0." This causes the output terminal of the AND gate 13 also to become "0" virtually simultaneously. Even if the pulse width of the phase inversion signal is relatively great, and the lower input terminal of the AND gate becomes "1" after the transistor 16 becomes nonconductive as the slave flip-flop 4 is set by the regular input terminal $Q_1$ of the master flip-flop 1, causing the complementary output terminal $\overline{Q_4}$ of the slave flip-flop to become "0," the output terminal of the AND gate 13 will be maintained at a "0" value during the remainder of the period $t_7$. Since both the SET and RESET input terminals of the master flip-flop are maintained at "0" under such conditions, the state of conductivity of the master flip-flop is unchanged during the remainder of the time interval $t_7$.

Figure 7:
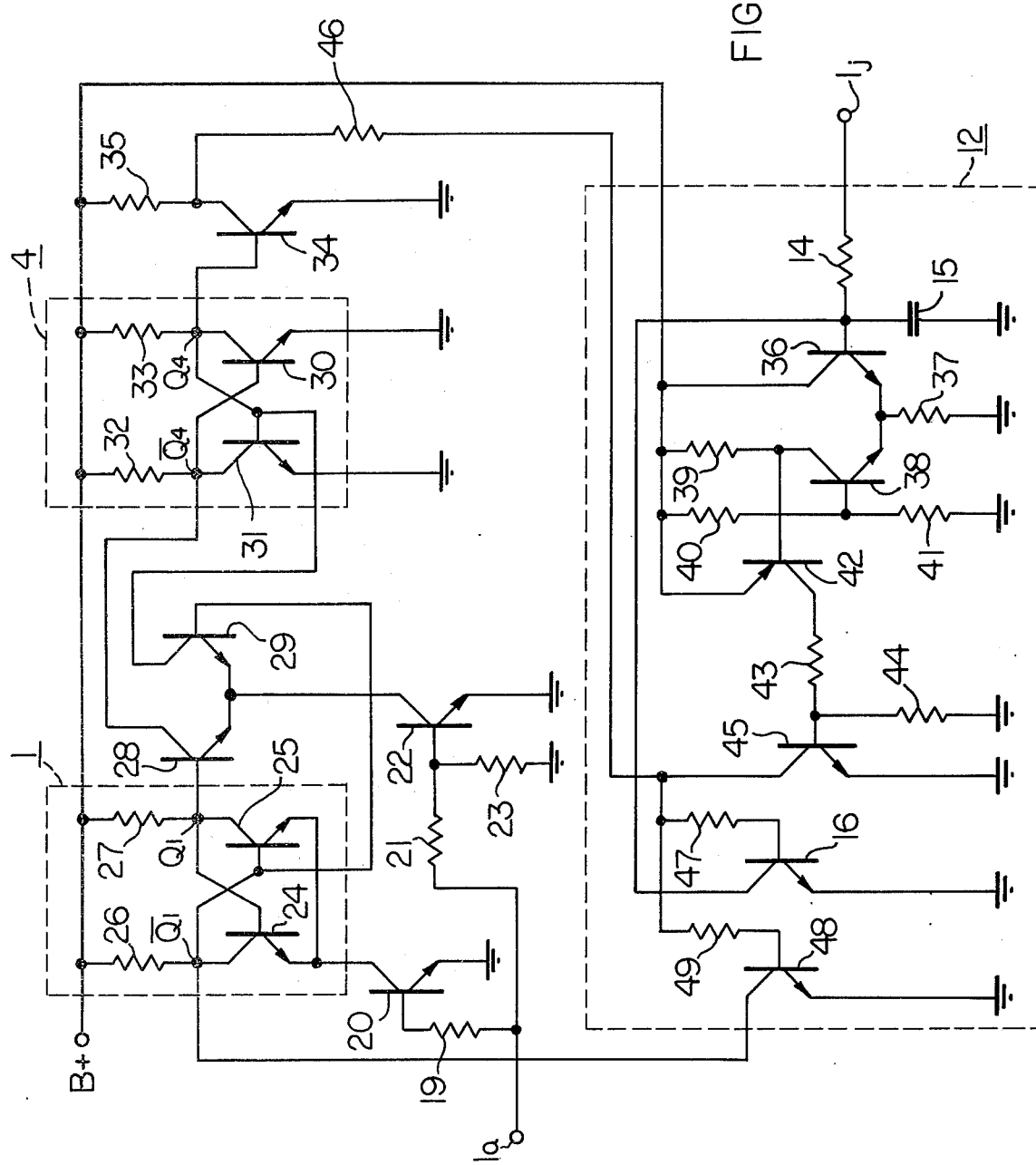
FIG. 7 is a schematic circuit diagram corresponding to the block circuit diagram in FIG. 5.

FIG. 7 shows a schematic circuit diagram representing the block diagram in FIG. 5. The same reference numerals are applied to circuits in FIG. 7 that correspond to circuits in FIG. 5, and the detailed explanation of those circuits is therefore abbreviated.

An input signal from the input terminal $1a$ is supplied through a resistor 19 to the base of an NPN transistor 20. The same input signal is also supplied through a resistor 21, which is part of a voltage divider, to the base of a transistor 22. A resistor 23 connected between the base of the transistor 22 and ground constitutes the other part of the voltage divider. The collector of the transistor 20 is connected to the emitters of two NPN transistors 24 and 25 in the master flip-flop 1, and the emitter of the transistor 20 is grounded. The collector of the transistor 24 is connected to the base of the transistor 25 and is also connected through a load resistor 26 to a power supply terminal B+. In like manner the collector of the transistor 25 is connected to the base of the transistor 24 and is also connected to the power supply terminal B+ by way of a load resistor 27.

The collector-emitter circuit of the transistor 22 is connected in series between the emitters of two NPN transistors 28 and 29 and ground. The bases of the transistors 28 and 29 is connected to the collectors of the transistors 25 and 24, respectively, and the collectors of the transistors 28 and 29 are connected to the bases of two transistors 30 and 31, which form the active element of the slave flip-flop 4. The collector of the transistor 28 is also connected to the collector of the transistor 31 and, through a load resistor 32 to the B+ terminal. Correspondingly, the collector of the transistor 29 is connected to the collector of the transistor 30 and, through a load resistor 33, to the B+ terminal. The collector of the transistor 30 is also connected directly to the base of an NPN transistor 34 which is connected as a grounded emitter circuit. The collector of the transistor 34 is connected to the B+ terminal by way of a load resistor 35. The transistor 34 inverts the output signal at the collector of the transistor 30.

The phase inversion signal applied to the terminal $1j$ passes through the integrating circuit resistor 14 to the base of a transistor 36. The base of the transistor 36 is grounded through the capacitor 15 to achieve the slightly integrating operation of the RC circuit. The collector of the transistor 36 is connected directly to the power supply terminal B+ and the emitter of the transistor 36 is connected to ground by way of a resistor 37. The emitter of the transistor 36 is also connected to the emitter of another NPN transistor 38, the collector of which is connected through a load resistor 39 to the power supply terminal B+. A biasing circuit comprising resistors 40 and 41 is connected to the base of the transistor 38 to establish a reference voltage at that point.

The collector of the transistor 38 is connected to the base of a PNP transistor 42, the emitter of which is directly connected to the power supply terminal B+. The collector of the transistor 42 is connected to ground through a series circuit comprising two resistors 43 and 44. The junction between the latter resistors is connected to the base of a transistor 45, the emitter of which is grounded. A resistor 46 connects the collector of the transistor 34 to the collector of the transistor 45, and through a resistor 47 to the base of the transistor 16. As shown in FIG. 5, the emitter collector circuit of this NPN transistor is connected directly in parallel with the capacitor 15. The resistor 46 also connects the collector of the transistor 34 to the base of an NPN transistor 48 by way of another series connected resistor 49. The collector of the transistor 48 is connected back to the common circuit point of the collector of the transistor 24 and the load resistor 26.

The operation of the circuit in FIG. 7 will be explained with reference to the waveforms in FIG. 6, since FIG. 7 is basically only a more detailed circuit drawing corresponding to the circuit diagram in FIG. 5. The input timing signal in FIG. 6A applied to the input terminal $1a$ although illustrated as being perfectly square actually has some slope to both the leading and lagging edge of each of the pulses such as the pulse $P_4$. As a result, the signal applied through the resistor 19 to the base of the transistor reaches the conductivity level of that transistor more quickly than the voltage applied through the attenuation produced by the resistors 21 and 23. The attenuation causes the transistor 22 to become conductive just slightly after the transistor 20. The converse is true at the lagging edge of each of the pulses making up the timing signal in FIG. 6A; the transistor 22 reaches its cutoff level just slightly before the transistor 20 reaches its cutoff level. It is convenient to call the transition time between cutoff and non-cutoff as a transient condition and to refer to the condition in which the timing pulses are either at their "0" value or their "1" value for a relatively long time as the steady state condition.

If the phase inversion signal applied to the input terminal 1j is "0," the transistor 36 will be nonconductive. By differential operation, the transistor 38 will be conductive and produce a voltage drop across the resistor 39 that causes the transistor 42 to be conductive. The current flowing through the base emitter circuit of the transistor 42 also flows through the resistors 43 and 44. This raises the voltage at the base of the transistor 45 to a "1" value and causes the bases of the transistors 16 and 48 to be at the "0" value, no matter whether the collector of the transistor 34 is a "1" or a "0".

Figure 6:
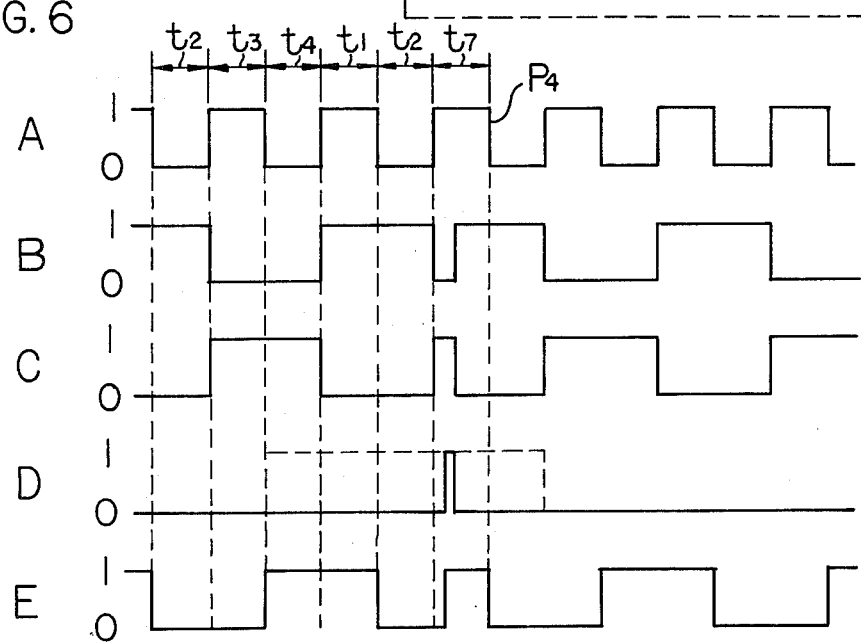
FIG. 6 shows operating signals obtained in the use of the circuit in FIG. 5.

In the time period $t_2$ in FIG. 6, the normal output terminal $Q_1$ of the master flip-flop is "0" and the normal output of the slave flip-flop is "1" and both of the transistors 20 and 22 are nonconductive. At the beginning of the time period $t_3$ when the input signal in FIG. 6A is rising, the transistor 20 becomes conductive first while the transistor 22 is still nonconductive, thereby causing the transistors 28 and 29 to continue to be nonconductive. This is the transient condition during which the state of conductivity of the flip-flops 1 and 4 is changing, and in this condition as the complementary output terminal $\overline{Q_1}$ of the master flip-flop is "1," the transistor 25 becomes conductive and the transistor 24 still remains nonconductive. The normal output terminal $Q_1$ at the collector of the transistor 25 is "0" and the complementary output $\overline{Q_1}$ at the collector of the transistor 24 is "1." Slightly later during the transient condition the transistor 22 becomes conductive as the complementary output $\overline{Q_1}$ is "1" and the normal output terminal $Q_1$ is "0." Due to the conductivity of the transistor 22 and the signals applied to the transistors 28 and 29 from the terminals $Q_1$ and $\overline{Q_1}$, the transistor 29 becomes conductive and the transistor 28 remains nonconductive. This is the steady condition during the interval $t_3$. At the beginning of this steady condition, when the transistor 29 is conductive, the normal output terminal $Q_4$ at the collector of the transistor 30 in the slave flip-flop 4 becomes "0" and so the transistor 31 becomes nonconductive, causing the complementary output terminal $\overline{Q_4}$ at the collector of the transistor 31 to become "1." This condition, in which the transistor 31 is nonconductive and the transistor 30 is conductive lasts until the end of the timing interval $t_3$.

At the beginning of the timing interval $t_4$, when the timing pulse is descending from its "1" value to its "0" value, the transistor 22 becomes nonconductive just ahead of the transistor 20. When the transistor 22 becomes nonconductive the transistor 29 also becomes nonconductive, but since the transistor 28 is still nonconductive, the condition of conductivity of the slave flip-flop 4 is not changed and so the normal output terminal $Q_4$ remains at "0" and the complementary output terminal $\overline{Q_4}$ remains at "1."

When the transistor 25 also becomes nonconductive, the transistor 24 in the master flip-flop 1 is still nonconductive and so the current does not flow through the resistor 27 and, therefore, does not flow through the collector-emitter circuit of the transistor 25 any longer. Moreover, as the complementary output terminal $\overline{Q_4}$ is still "1," the current does not flow through the resistor 27 and the base collector circuit of the transistor 28. Therefore, the normal output terminal $Q_1$ of the master flip-flop changes from "1" to "0." This causes the complementary output terminal $\overline{Q_1}$ to become "0" because of the current flowing through the resistor 26 and the base collector path of the transistor 29, which operates as a reverse transistor under these conditions. This condition lasts until the end of the timing interval $t_4$. A similar operation can be repeated as long as the phase inversion signal is "0" and the transistor 45 is conductive.

When the phase inversion signal is "1," and the complementary output terminal $\overline{Q_4}$ of the slave flip-flop 4 is 37 1" and the complementary output terminal $\overline{Q_1}$ of the master flip-flop is also "1," and furthermore, when the input timing signal in FIG. 6A is "1," the conditions correspond to the period $t_7$ in FIG. 6. The transistor 45 can now become nonconductive and, as the transistor 34 is nonconductive so that its collector is "1", the transistors 48 and 16 are able to become conductive. Therefore, the complementary output terminal $\overline{Q_1}$ changes from "1" to "0." The transistor 25 becomes nonconductive and the normal output terminal $Q_1$ changes from "0" to "1." At the same time the transistor 28 is turned on and the transistor 29 is turned off. Then the condition of conductivity of the slave flip-flop 4 is changed, and the complementary output terminal $\overline{Q_4}$ becomes "0" and the normal output terminal $Q_4$ becomes "1." Thus, after the phase inversion signal in the period $t_7$, the phases of the normal output terminals $Q_1$ and $Q_4$ are inverted.

While this invention has been described in terms of specific embodiments, it will be understood by those skilled in the art that modifications may be made therein within the true scope of the invention as defined by the following claims.

What is claimed is:

1. A master-slave, flip-flop circuit comprising:
a first input terminal to which a timing signal is applied;
a master flip-flop circuit having input terminals and output terminals;
a slave flip-flop circuit having input terminals and output terminals;
gating means for connecting said output terminals of said master flip-flop circuit to said input terminals of said slave-flip-flop circuit and for connecting said output terminals of said slave flip-flop circuit to said input terminals of said master flip-flop circuit;
said first input terminal being connected to said gating means to control the operation thereof with the assistance of output signals from said output terminals of said master flip-flop circuit and from said output terminals of said slave flop-flop circuit;
a gating circuit separate from said gating means and having a connection to one of said output terminals of said slave flip-flop circuit and connected to one of said input terminals of said master flip-flop circuit to assist in controlling the operation of said master flip-flop circuit; and
a second input terminal to receive signals to produce phase inversion of the output signals of said master-slave flip-flop circuit, said second input terminal being connected to said gating circuit to cooperate with said connection to said one output terminal of said slave flip-flop circuit in controlling the operation of said gating circuit to achieve controlled phase inversion of the signals at said output terminals of said slave flip-flop circuit.

2. The master-slave flip-flop circuit in claim 1 in which the complementary output terminal of said slave flip-flop is connected to said gating circuit.

3. The master-slave flip-flop circuit in claim 1 comprising an OR gate having an output terminal connected to one of said input terminals of said master flip-flop circuit and first and second input terminals connected, respectively, to said gating circuit and to said gating means.

4. The master-slave flip-flop circuit of claim 3 in which said gating circuit comprises:
an AND gate having a first AND gate input terminal connected to one of said output terminals of said slave flip-flop circuit and a second AND gate input terminal; and
means connecting said second input terminals to said second AND gate input terminal.

5. The master-slave flip-flop circuit of claim 4 in which said last-named means comprises an integrating circuit that includes a capacitor connected between said second AND gate input terminal and a constant voltage point.

6. The master-slave flip-flop circuit of claim 5 comprising a transistor having its emitter-collector circuit connected in parallel with said capacitor and its base connected to the output of said AND gate.

7. The master-slave flip-flop circuit of claim 1, wherein said gating means includes first and second pairs of AND gates, said first pair of AND gates being connected between said output terminals of said master flip-flop circuit and said input terminals of said slave flip-flop circuit and said second pair of AND gates being connected between said output terminals of said slave flip-flop circuit and said input terminals of said master flip-flop.

8. The master-slave flip-flop circuit of claim 7, wherein said first input terminal is connected to an input of each of the AND gates of said first and second pairs of AND gates.

9. The master-slave flip-flop circuit of claim 1, wherein each of said master flip-flop input terminals is coterminous with a separate master flip-flop output terminal and each of said slave flip-flop input terminals in coterminous with a separate slave flip-flop output terminal.

* * * * *